Nov. 13, 1951

W. J. FINNEY 2,574,470

FREQUENCY DETERMINATION

Filed March 1, 1946

4 Sheets-Sheet 1

INVENTOR.
WILLIAM J. FINNEY

BY M. A. Hayes

ATTORNEY

Nov. 13, 1951 W. J. FINNEY 2,574,470

FREQUENCY DETERMINATION

Filed March 1, 1946 4 Sheets-Sheet 2

INVENTOR.
WILLIAM J. FINNEY

BY M. O. Hayes

ATTORNEY

Inventor
WILLIAM J. FINNEY

By M. O. Hayes
Attorney

Inventor
WILLIAM J. FINNEY

By M. C. Hayes
Attorney

Patented Nov. 13, 1951

2,574,470

UNITED STATES PATENT OFFICE 2,574,470

FREQUENCY DETERMINATION

William J. Finney, Cambridge, Mass.

Application March 1, 1946, Serial No. 651,410

10 Claims. (Cl. 175—183)

(Granted under the act of March 3, 1883, as amended April 30, 1928; 370 O. G. 757)

This invention relates in general to systems for adjusting frequency selective devices to chosen frequencies and more particularly to systems for tuning an electrical resonant circuit to a selected frequency.

In numerous applications requiring the determination of the frequency of a selective circuit or oscillation generation device, it is necessary tc provide a means of evaluating the frequency thereof. In one method of frequency determination the selective circuit or device is excited to produce continuous oscillation at its resonant frequency. The continuous oscillations are then combined with a signal of known frequency to produce a beat or interference signal at the frequency difference. The interference signal is subsequently analyzed by aural or visual methods to determine the frequency difference between the two signals.

Accordingly, it is an object of the present invention to provide methods of tuning resonant circuits in which the resonant circuits are not required to be in a state of continual oscillation.

Another object of this invention is to provide methods for tuning resonant circuits by interference or beat signals produced between resonant circuits of different frequencies simultaneously excited to produce damped oscillations.

A further object of this invention is to provide a system for indicating the tuning of a resonant circuit with reference to resonant circuits of known frequency characteristics.

Another object of this invention is to provide a system for tuning an electrical resonant circuit to a predetermined frequency employing interference patterns produced between a plurality of resonant circuits simultaneously excited into damped oscillation.

Other and further objects and features of the present invention will become apparent upon a careful consideration of the following detailed description when taken together with the accompanying drawing, the figures of which illustrate typical embodiments of the invention and the manner in which those embodiments may be considered to operate.

Figure 1:
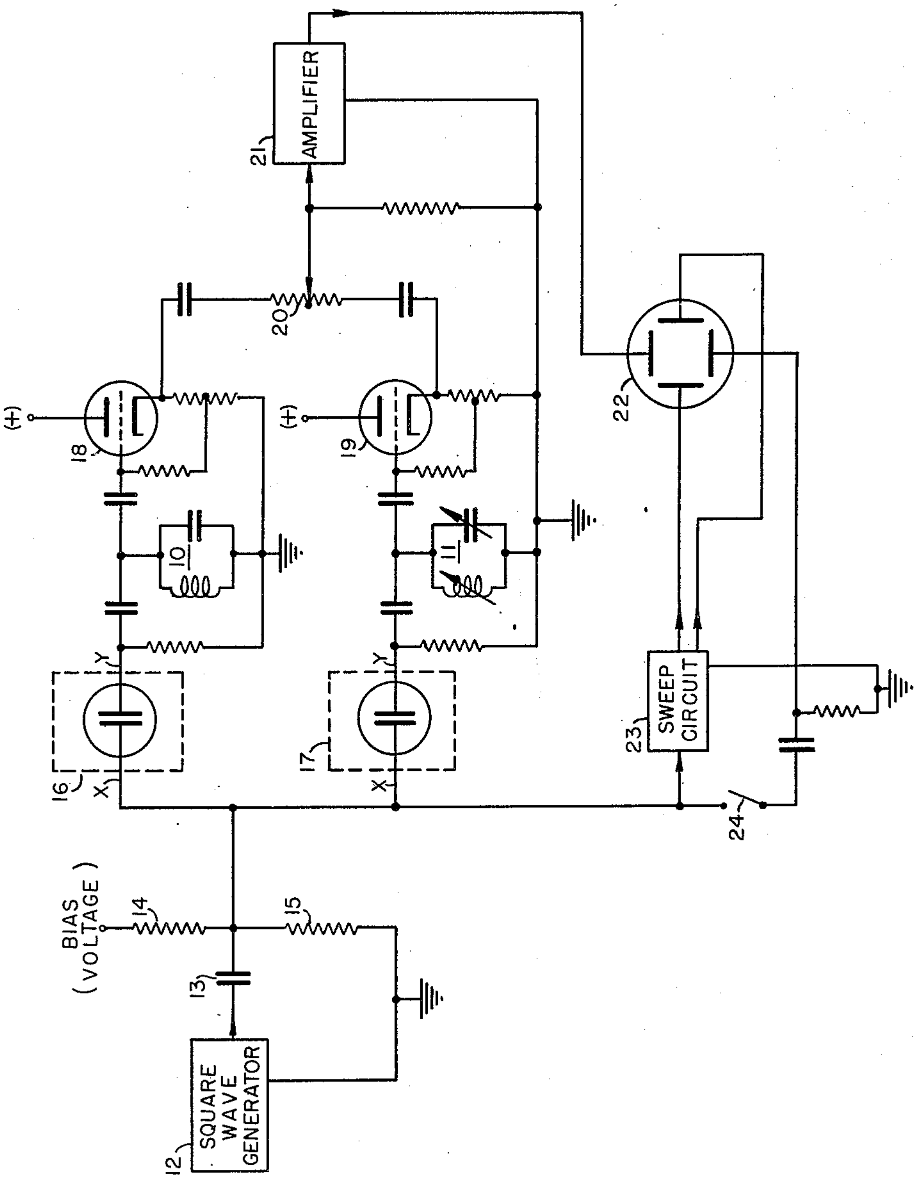
Fig. 1 is a schematic diagram, partly in block, illustrating a typical embodiment of the features of the present invention.
Figure 2:
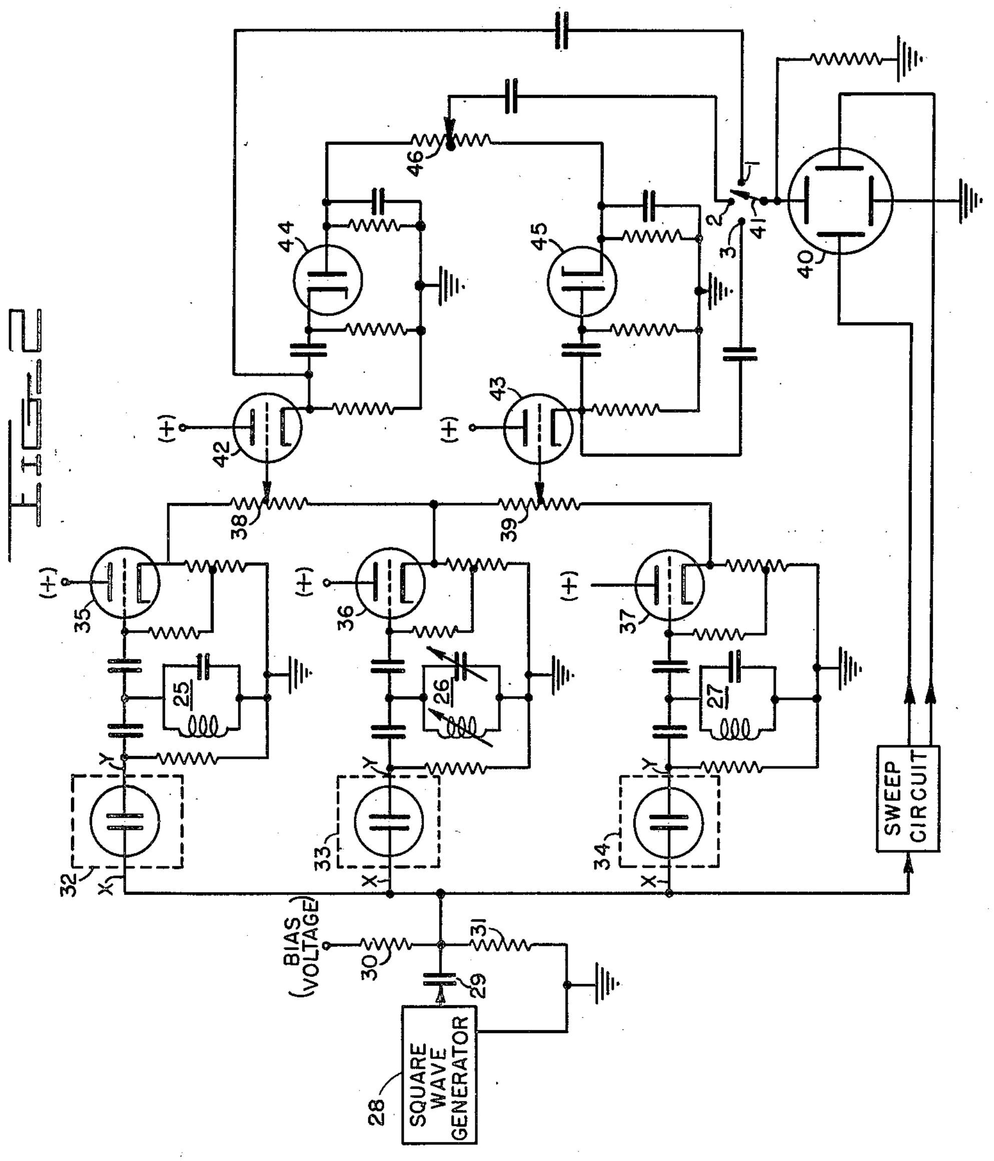
Fig. 2 is a schematic diagram, partly in block, illustrating a variant embodiment of the features of the present invention.
Figure 3:
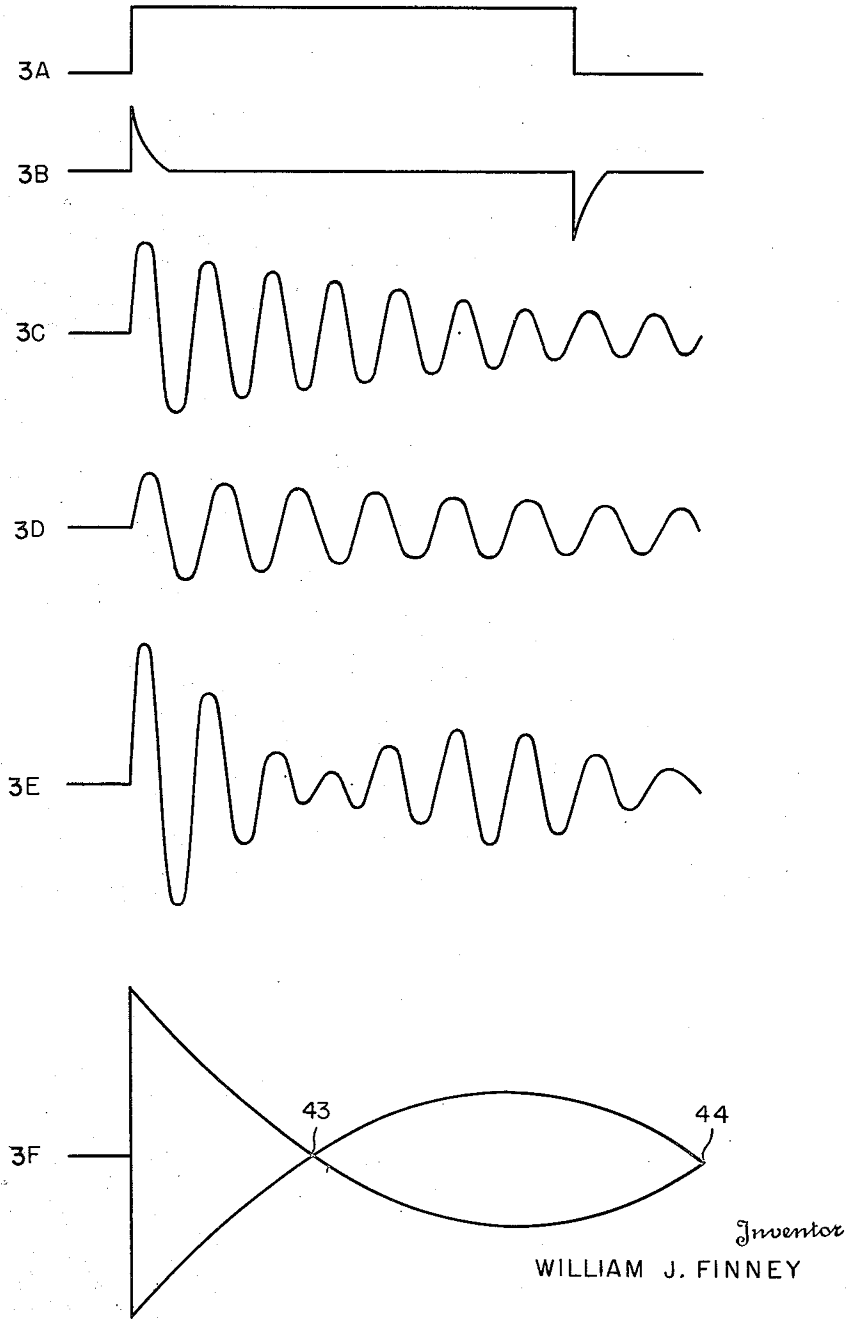

Figs. 3–A through 3–F and 4–A through 4–E show a series of typical waveforms illustrative of the operation of the circuits of Figs. 1 and 2, respectively.

Figure 5:
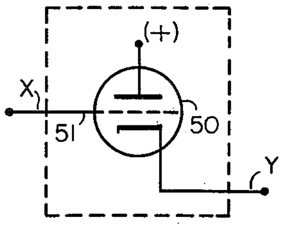

Fig. 5 shows an alternative excitation circuit for the frequency selective circuits.

According to the fundamental concept of the present invention, the tuning to a selected frequency of an electrical apparatus having unknown characteristics is accomplished by shock exciting the apparatus into a series of damped sinusoidal oscillations. Simultaneously a reference apparatus having known characteristics is also shock excited into a series of damped oscillations. Interference patterns produced by the oscillatory signals from the reference apparatus and the apparatus having unknown characteristics are obtained and observed with the aid of a cathode ray tube indicator. From these interference patterns, information regarding the frequency and other characteristics of the unknown apparatus is obtained.

With reference to Fig. 1, a particular embodiment illustrative of the features of the present invention is shown as applied to the determination of the free resonant frequency of an electrical circuit and the tuning of two such circuits to a selected frequency difference. A first electrical resonant circuit 10 having known characteristics is employed to provide a signal with reference to which a second resonant circuit 11 of unknown characteristics is tuned. Both circuits are simultaneously thrown into a series of damped sinusoidal oscillations, preferably by means of a signal from a square wave generator 12. The square wave signal from generator 12 as shown in Fig. 3–A is applied to the resonant circuits 10, 11 by means of a differentiating type coupling circuit including capacitance 13 and resistances 14, 15, and through an appropriate nonlinear discharge device such as 16, or 17. The positive peaks of the differentiated square wave signal shown in Fig. 3–B bring tubes 16, 17 to a state of ionization and conduction to initiate damped sinusoidal oscillations of circuits 10, 11, as previously mentioned. At the conclusion of the differentiated positive pulse, tubes 16 and 17 cease conduction and hence present minimum impedance loading across the resonant circuits.

To prevent possible reionization of the discharge tubes 16 and 17 on the negative differentiated peaks of the square waves it was found desirable to maintain a low positive potential across them by the voltage divider resistances 14 and 15 connected between a positive supply and ground. The positive potential maintained across tubes 16 and 17 is selected so that tubes 16 and 17 will not normally be conductive and cannot be rendered conductive by the negative differentiated peaks of the square wave, but are readily rendered conductive by the positive peaks of the differentiated square wave.

Measurement of the damped sinusoidal oscillations of circuits 10, 11, shown by Figs. 3–C and 3–D respectively, is facilitated by means of high input impedance cathode follower circuits 18, 19, respectively, which produce minimum loading, capacitively or resistively, upon the resonant circuits themselves.

The damped sinusoidal oscillations obtained from the cathodes of tubes 18 and 19 are applied to a mixing potentiometer 20 and thence through an amplifier 21 to a cathode ray tube indicator 22. The cathode ray tube indicator sweep circuit 23 is preferably of the externally triggered type, requiring the application of a keying voltage to initiate each sweep cycle. The keying voltage for the sweep circuit is furnished by the positive peak of the differentiated square wave obtained from the circuit 13, 14, 15. By means of this voltage, the sweep of the electron beam of the cathode ray tube indicator 22 is started from a reference point each time the resonant circuits 10 and 11 are shocked into oscillation.

At some period in time following the shock excitation and "in phase" oscillation of the circuits 10 and 11, any frequency difference between them will cause a phase shift such that 180 degree phase relationship exists between the oscillations thereof. If then, the potentiometer 20 is adjusted so that the voltages applied to amplifier 21 from the cathode followers 18 and 19 are equal, a condition of zero vertical signal amplitude on the scope 22 will result. This condition will occur after a time equal to one half the period of the difference frequency between circuits 10 and 11 and is shown by Fig. 3–E.

The frequency difference between circuits 10 and 11 is then readily calculated by measuring the elapsed time required after excitation for zero vertical signal amplitude to occur. Since this time represents the half period of the frequency difference, the frequency difference will be given by the following equation:

$$f=\frac{1}{2T}$$

where f=frequency difference
T=time interval required for 180° phase reversal of signal to occur.

The time interval required for 180 degree phase shift between signals may be conveniently measured by means of time markers applied to the cathode ray tube indicator 22 from any suitable source. A convenient source of timing signals is the differentiated square wave from the network 13, 14, 15. Thus when a marker control switch 24 is closed, the differentiated pulses of Fig. 3–B will appear superimposed upon the Fig. 3–E. In order for the marker source to be entirely suitable for such time interval measurement it is preferable that it permit controllable variation of the position of the negative pulse of Fig. 3–B with respect to the start of Fig. 3–E corresponding to the instant of excitation of the circuits 10 and 11. Such controllable variation is readily obtained with the generator 12 by adjustment of the duration of the positive portion of the signal produced thereby.

It is apparent from this discussion that the circuit 11 having unknown characteristics can be tuned to a difference frequency above or below that of circuit 10 and still produce the same indication on indicator 22. For this reason care must be observed in the tuning procedure to determine which of the points above or below is obtained. One method by which this may be accomplished requires the knowledge of the direction of increasing frequency of the controls of the elements of the variable frequency circuit 11. Thus it is possible to observe the effect of a change of frequency of circuit 11 upon the time position of the 180 degree phase relationship.

The apparatus of Fig. 1 may also be used to indicate the relative "Q-factor" or the relative ratio of energy stored to energy dissipated in circuit 11 with respect to the ratio of energy stored to energy dissipated in circuit 10. Since the rate of decay of the amplitude of the sinusoidal voltage across a shock excited resonant circuit is a function of the "Q-factor" of the circuit and both circuits are excited to oscillations of the same initial amplitude, it follows that the setting of the variable tap on potentiometer 20 will be different if a circuit having a different "Q-factor" but the same frequency is inserted in place of circuit 11. Potentiometer 20 may be calibrated positionally for circuits inserted at position 11 having known "Q-factors." Thereafter the "Q-factor" of an unknown circuit inserted at position 11 can be determined by the calibration of potentiometer 20.

With reference now to Fig. 2, a second embodiment of the principles of the present invention is shown incorporating two reference shock excited circuits instead of the single reference frequency circuit of Fig. 1 to obviate possible frequency ambiguity as mentioned in connection with the apparatus of Fig. 1.

In accordance with the discussion of Fig. 1, three resonant circuits 25, 26, and 27 are shock excited into damped sinusoidal oscillations by the positive peaks of a differentiated square wave from the generator 28 applied through a short time constant circuit 29, 30, 31 and the electron tubes 32, 33, and 34.

The oscillatory signals produced across the resonant circuits 25, 26, and 27 are fed through high input impedance cathode followers 35, 36, and 37 respectively to a pair of mixing potentiometers 38 and 39. Thus the signals from the reference circuit 25 tuned above the desired frequency of the unknown circuit 26 are combined in potentiometer 38 to produce an interference pattern similar to that produced by the circuit of Fig. 1. This pattern may be observed on a cathode ray tube indicator 40 and potentiometer 38 adjusted to amplitude cancellation in the same manner as potentiometer 20 of Fig. 1, when switch 41 is in position 1. To facilitate this operation, a cathode follower 42 is employed to prevent loading of potentiometer 38.

Similarly an interference signal between the signal of the reference circuit 27 tuned below the desired frequency of circuit 26, is obtained. This signal may be viewed on the indicator 40 to obtain the correct setting of potentiometer 39 when switch 41 is in position 3. Again loading of potentiometer 39 is prevented by a cathode follower 43.

To tune the unknown resonant circuit 26 precisely at the mid-frequency between the known frequencies of circuits 25 and 27, the interference signal obtained from cathode follower 42 is rectified to produce a negative envelope signal at the plate of diode 44 and the interference signal from cathode follower 43 is rectified to produce a positive envelope signal at the cathode of diode 45. The positive and negative envelope signals are combined in a potentiometer 46 and applied to the indicator 40 when switch 41 is in position 2. Thus, when the envelope signals are equal and opposite in amplitude at all times subsequent to the instant of shock excitation, a condition of zero vertical deflection of the electron beam will exist. This condition can only occur when the interference frequency between circuits 25 and 26 is equal to that between circuits 26 and 27.

Figure 4:
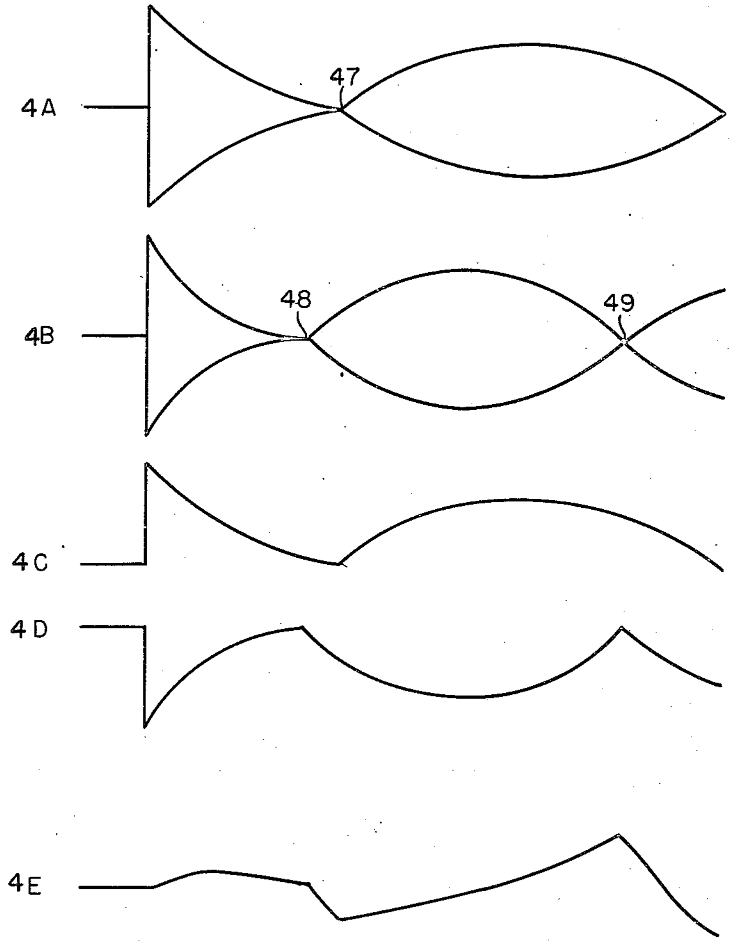

Figs. 4–A through 4–E are included to illustrate more precisely the action of the circuit of Fig. 2. For these illustrations a condition of slightly incorrect tuning of circuit 26 is chosen with circuit 26 tuned nearer to the frequency of circuit 25 than to the frequency of circuit 27. Fig. 4–A shows the envelope of the interference pattern between circuits 25 and 26 as observed with switch 41 in position 1 and the correct setting of potentiometer 38 to produce signals of equal amplitude and opposite phase at point 47. Fig. 4–B shows the interference pattern between circuits 26 and 27 as observed with switch 41 in position 3, and the correct setting of potentiometer 39 to produce signals of equal amplitude and opposite phase at points 48 and 49.

Figs. 4–C and 4–D show, respectively, the rectified unilateral signal as observed at the cathode of diode 45 and the plate of diode 44.

Fig. 4–E shows the combination of these two waveforms with switch 41 in position 2 to produce a signal of the undesired type. With circuit 26 tuned to the median of circuits 25 and 27, points 47 and 48 of Figs. 4–A and 4–B, respectively, would occur in time coincidence to produce a straight line signal instead of that of Fig. 4–E.

In Fig. 5 is shown an alternate arrangement for shock exciting the resonant circuits 10, 11, 25, 26, and 27 of Figs. 1 and 2 into damped sinusoidal oscillations in applications where the simple gaseous diode tubes are not desirable. A cathode follower type circuit with an electron tube 50 is employed in Fig. 5 with connections to X and Y as indicated in Figs. 1 and 2. With the cathode follower circuit of Fig. 5 installed in preference to the gaseous diode tubes, it is preferable that a negative biasing voltage be maintained at the grid 51 of tube 50 to hold the same non-conductive. This biasing voltage is applied through the appropriate voltage divider 14, 15 or 30, 31. The differentiated positive peaks of the square wave as applied to the grid 51 of tube 50 bring tube 50 to heavy conduction to initiate oscillation of the associated tuned circuit. Thereafter tube 50 remains non-conductive and is not reflected as a load upon the oscillatory circuit.

From the foregoing discussion it is apparent that considerable modification of the features of this invention are possible, and while the devices herein described and the forms of apparatus for the operation thereof constitute preferred embodiments of the invention it is to be understood that the invention is not limited to these precise devices or forms shown, and that changes may be made therein without departing from the scope of the invention which is defined in the appended claims.

This invention described herein may be manufactured and used by or for the Government of the United States of America for governmental purposes without the payment of any royalty thereon or therefor.

What is claimed is:

1. A method of determining the frequency of a resonant circuit, comprising; simultaneously shock exciting a plurality of resonant circuits at least one of which has known frequency characteristics into a series of damped oscillations, and measuring the time interval after excitation subsequently required to achieve selected phase and amplitude relationships between the oscillatory signals.

2. A method of determining the frequency difference between two resonant circuits, comprising; simultaneously shock exciting a circuit having known characteristics and a circuit having unknown characteristics into damped oscillations, combining the oscillatory signals produced by the two circuits to obtain interference patterns, and measuring the time interval after excitation subsequently required for occurrence of phase opposition and equal amplitude of the combined signal in the interference patterns.

3. A method of tuning two resonant energy storage circuits to a selected frequency difference, comprising; simultaneously shock exciting the tuned circuits into a series of damped oscillations, and measuring the time interval after excitation subsequently required to achieve selected phase and amplitude relationships between the oscillatory signals.

4. An apparatus for determining the frequency of a first resonant circuit, comprising: a reference resonant circuit tuned to a frequency substantially the same as the frequency desired for the first resonant circuit, excitation means connected to the first resonant circuit and the reference resonant circuit for simultaneously initiating a series of damped oscillations in both resonant circuits, separate isolating amplifiers connected to the resonant circuits combining the damped oscillations thereof into a single line, a cathode ray tube signal presentation device connected to the isolating amplifiers responsive to the combined signals therefrom, and a time marker signal delivery circuit connected firstly to the excitation means to receive a signal therefrom and secondly to the signal presentation device to supply a time marker signal thereto.

5. An apparatus for determining the frequency of a first resonant circuit, comprising: a first reference resonant circuit whose tuned frequency is above the desired frequency of the first resonant circuit by a measurable amount, a second reference resonant circuit whose tuned frequency is below the desired frequency of the first resonant circuit by the same measurable amount, excitation means connected to the first resonant circuit and to the first and second reference resonant circuits for simultaneously initiating a series of damped oscillations in the three circuits, first signal combining means responsive to the signals from the first resonant circuit and the first reference resonant circuit to produce an output signal therefrom of a first polarity, second signal combining means responsive to the signal from the first resonant circuit and the second reference resonant circuit to produce a second output signal of polarity opposite to the first, third combining means responsive to the first and second output signals for providing a third combined output signal, a time sensing means connected to the first, second and third signal combining means responsive to the combined oscillations for measuring the interval of time required for the occurrence of known phase difference between the damped oscillations.

6. An apparatus for determining the frequency difference between two resonant circuits, comprising: excitation means for simultaneously initiating a series of damped oscillations in the resonant circuits, signal combining means connected to the resonant circuits combining the damped oscillations of both resonant circuits, and time sensing means fed by the last named means responsive to the combined oscillations for measuring the interval of time after excitation required for the occurrence of known phase difference between the damped oscillations.

7. A frequency measuring device, comprising: a plurality of resonant circuits, excitation means connected to said circuits for simultaneously exciting a series of oscillations in each, and time measuring means connected to said tuned circuits and to the excitation means for determining the time interval after excitation required to establish predetermined phase relationships between the oscillations of said series following simultaneous excitation of said circuits.

8. A frequency measuring device, comprising: a plurality of resonant circuits, excitation means connected to the resonant circuits for simultaneously initiating a series of independent damped oscillations in each, and time measuring means determining the frequency difference between said oscillations in dependency on the time interval after excitation between simultaneous excitation of said circuits and the existence of a predetermined phase relationship between said oscillations.

9. A frequency determining apparatus, comprising: a first circuit resonant at an unknown frequency, a second circuit resonant at a known frequency, excitation means connected to the first and second circuits simultaneously shock exciting said first and second circuits into independent series of damped oscillations, and time measuring means responsive to the oscillations of the said resonant circuits giving said unknown frequency in dependency on the time interval after excitation between simultaneous excitation of said circuits and the establishment of a predetermined phase relationship between the said series of damped oscillations.

10. An apparatus for determining the frequency difference between two resonant circuits, comprising: excitation means connected to the two resonant circuits for simultaneously initiating a series of damped oscillations in both resonant circuits, isolating amplifiers connected to the resonant circuits combining the damped oscillations thereof into a single line, a cathode ray tube signal presentation device connected to the isolating amplifiers responsive to the combined signals therefrom, and a time marker signal delivery circuit connected firstly to the excitation means to receive a signal therefrom and secondly to the signal presentation device to supply a time marker thereto.

WILLIAM J. FINNEY.

REFERENCES CITED

The following references are of record in the file of this patent:

UNITED STATES PATENTS

| Number | Name | Date |
|---|---|---|
| 2,203,750 | Sherman | June 11, 1940 |
| 2,252,058 | Bond | Aug. 12, 1941 |
| 2,266,668 | Tubbs | Dec. 16, 1941 |

OTHER REFERENCES

Electronics, September 1944, pp. 138–140, 336, 338.

Du Mont Oscillographer, vol. 7, No. 2, March–April 1945, pp. 1–4.